United States Patent

[11] 3,569,796

[72] Inventor Charles D. Mulford, Jr.
Union, N.J.

[21] Appl. No. 728,213
[22] Filed May 10, 1968
[45] Patented Mar. 9, 1971
[73] Assignee Solitron Devices, Inc.
Tappon, N.Y.

[54] INTEGRATED CIRCUIT CONTACT
5 Claims, 2 Drawing Figs.

[52] U.S. Cl. .......... 317/234, 317/235
[51] Int. Cl. .......... H01l 1/14
[50] Field of Search .......... 317/234, 235, 3, 3.1, 5, 5.3, 5.4, 22; 29/195, 198; 317/101 (A)

[56] References Cited

UNITED STATES PATENTS

| | | | |
|---|---|---|---|
| 3,341,753 | 9/1967 | Cunningham et al. .......... | 317/234 |
| 3,383,568 | 5/1968 | Cunningham .......... | 317/235 |
| 3,436,616 | 4/1969 | Jarrad .......... | 317/234 |

OTHER REFERENCES

IBM Technical Disclosure Bulletin, Metal Contacts To Semiconductor Devices, By R. P. Sopher and P. A. Totta, Vol. 10, No. 2, July 1967, Pages 158 and 159

*Primary Examiner*—John W. Huckert
*Assistant Examiner*—R. F. Polissack
*Attorney*—Bernard Malina

ABSTRACT: An integrated circuit contact assembly which utilizes an innerface metal over the oxide between the element contact and the connecting wire.

INVENTOR.
CHARLES D. MULFORD JR.
BY [signature]
ATTORNEY

INTEGRATED CIRCUIT CONTACT

BACKGROUND OF THE INVENTION

1. Field of the Invention

The invention relates to the field of applying electrical contacts to semiconductor devices and more particularly to integrated circuits.

2. Description of the Prior Art

Heretofore it has been the practice to make intermetallic bonds between gold and aluminum. Such bonds normally cause a degradation of bonding strength as well as increasing the resistance of the ohmic contact. It can eventually result in an open circuit due to the voids that form between the gold and aluminum interface. These formations are dependent upon the pressure, temperature, and time of the bonding operations. As the number of bonds required to complete the integrated circuit increases, the number and size of the voids increase. The present invention provides a contact arrangement that eliminates the aforenoted problems.

SUMMARY OF THE INVENTION

A contact assembly for an integrated circuit in which an aluminum contact on a semiconductor device is connected by a molybdenum innerface on the oxide to a connecting wire.

DESCRIPTION OF THE PREFERRED EMBODIMENT

Figure 1:
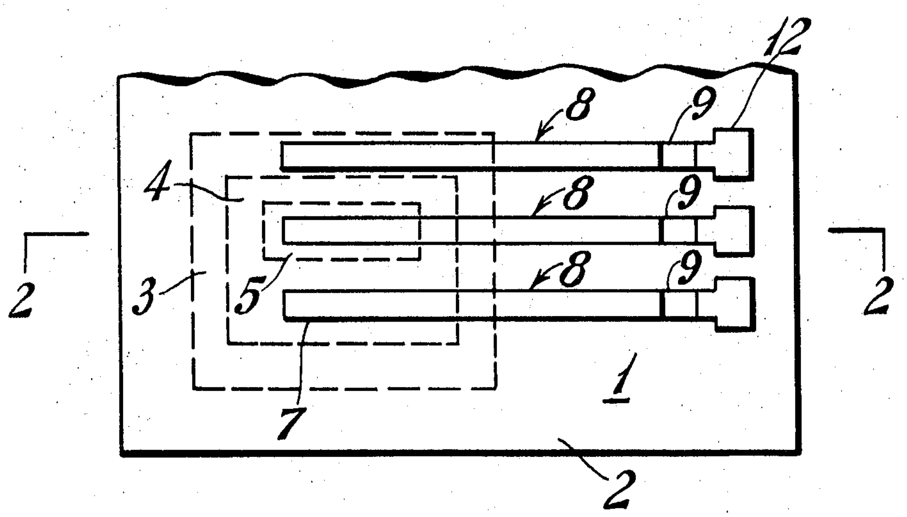
FIG. 1 is a plane view of a device embodying the invention.
Figure 2:
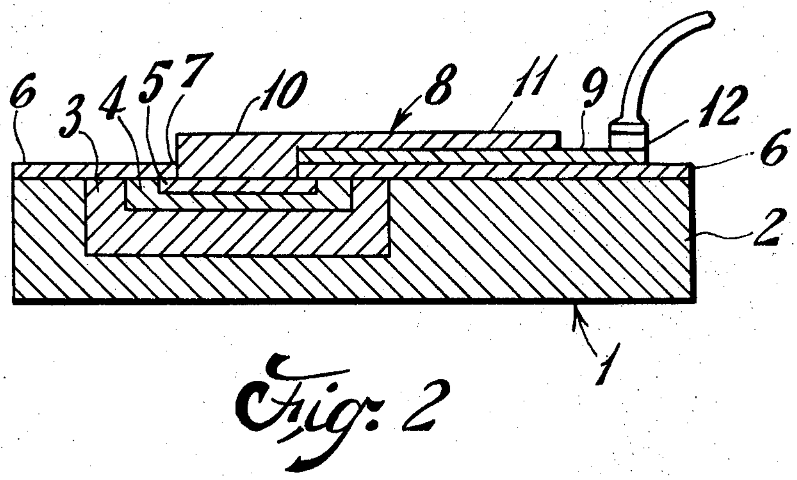
FIG. 2 is a cross section view of the device of FIG. 1 taken along the lines 2–2.

Referring now to the drawing, a semiconductor device is indicated generally by the numeral 1 and may be of the type used in integrated circuits. The device 1 may be silicon and having regions of different conductivity with rectifying junctions therebetween. For the purpose of illustration the device 1 has a substrate 2 of a P+ material into which a collector 3, base 4 and emitter 5 are formed by masking and diffusion or in other known manner. While only one active device is shown in the substrate 2, it is understood that there would be other devices formed therein.

A layer of silicon oxide 6 ($Si\ O_2$) is provided over the substrate 2. Openings 7 are formed in the oxide 6 for contact assemblies 8. The contact assemblies 8 are provided by forming a layer of innerface metal 9, for example molybdenum, on the oxide 6 by vapor deposition or other suitable process. Contact members 10 of good conductivity, for example aluminum, are secured to the respective collector 3, base 4 and emitter 5 and have a portion 11 extending over the innerface metal 9. The contact member 10 is fused with the innerface metal by heating for a predetermined time and temperature, for example at 500° F. for 30 minutes. The innerface metal 9 terminates as a contact pad 12 to which wires 13, for example gold, are bonded by thermal compression.

By the use of the innerface metal 9, a bond between the wire, which may be of other metal than gold such as aluminum, will be reliable under temperature cycling as well as providing good ohmic contacts to the active device. Further the innerface metal prevents aluminum from migrating during temperature cycling into the silicon oxide thereby causing a short circuit.

Although only one embodiment has been illustrated and described, various changes in the form and relative arrangement of the parts, which will now appear to those skilled in the art, may be made without departing from the scope of the invention.

I claim:

1. A contact assembly for an integrated circuit formed on a substrate and having active elements therein, comprising a layer of insulation in register with the surfaces of said active elements, innerface metal contact strips extending from said openings over said layer of insulation, and contact members of a metal having good conductivity secured to said active elements and extending over a portion of said innerface metal contact strips beyond said openings, said innerface metal contact strips respectively extending beyond said contact strips to terminate in contact pads respectively.

2. The combination as set forth in claim 1 in which said innerface metal contact strips are molybdenum.

3. The combination as set forth in claim 1 in which said contact members are aluminum.

4. The combination as set forth in claim 1 and including a contact wire secured to said contact pad.

5. The combination as set forth in claim 1 in which said innerface contact strip and said contact member are fused together to form a unitary structure.